(12) United States Patent
Volpe

(10) Patent No.: US 11,900,024 B1
(45) Date of Patent: Feb. 13, 2024

(54) SIMULATING NETWORK PACKETS IN A PACKET PROCESSING PIPELINE

(71) Applicant: Amazon Technologies, Inc., Seattle, WA (US)

(72) Inventor: Thomas A. Volpe, Austin, TX (US)

(73) Assignee: Amazon Technologies, Inc., Seattle, WA (US)

( * ) Notice: Subject to any disclaimer, the term of this patent is extended or adjusted under 35 U.S.C. 154(b) by 565 days.

(21) Appl. No.: 15/352,453

(22) Filed: Nov. 15, 2016

(51) Int. Cl.
*G06F 30/18* (2020.01)
*H04L 49/00* (2022.01)

(52) U.S. Cl.
CPC .......... *G06F 30/18* (2020.01); *H04L 49/3063* (2013.01)

(58) Field of Classification Search
CPC .......... G06F 30/18; G06F 30/12; G06F 30/20; G06F 30/25; G06F 30/27; G06F 30/28; H04L 49/3063; H04W 16/18
See application file for complete search history.

(56) References Cited

U.S. PATENT DOCUMENTS

| | | | | |
|---|---|---|---|---|
| 6,560,720 B1 * | 5/2003 | Chirashnya | ........... | G06F 11/277 714/E11.175 |
| 7,864,800 B2 * | 1/2011 | Takada | .................... | H04L 12/66 370/465 |
| 8,195,989 B1 * | 6/2012 | Lu | ........................ | H04L 43/0811 370/242 |
| 8,681,819 B2 * | 3/2014 | Abel | ........................ | H04L 69/22 370/252 |
| 9,054,975 B2 | 6/2015 | Feldmann et al. | | |
| 2007/0053303 A1 * | 3/2007 | Kryuchkov | ......... | H04L 43/0852 370/252 |
| 2011/0219208 A1 * | 9/2011 | Asaad | ....................... | G06F 9/06 712/12 |
| 2012/0170472 A1 * | 7/2012 | Chen | .................... | H04L 49/9073 370/252 |
| 2014/0133305 A1 * | 5/2014 | Brolin | ..................... | H04L 43/10 370/235 |
| 2014/0195630 A1 * | 7/2014 | Malik | ..................... | G06F 13/28 709/212 |
| 2016/0173600 A1 * | 6/2016 | Galles | ................. | H04L 67/1097 709/212 |
| 2017/0171044 A1 * | 6/2017 | Das | ........................ | H04L 69/329 |
| 2018/0024755 A1 * | 1/2018 | Hassan | ............... | G06F 12/0623 711/112 |

OTHER PUBLICATIONS

Noction Network Intelligence, Intelligent Routing Platform, 2014, Noction Holdings Ltd., Version 3.9m, p. 183 (Year: 2014).*

* cited by examiner

*Primary Examiner* — Michael Edward Cocchi
(74) *Attorney, Agent, or Firm* — S. Scott Foster; Kowert, Hood, Munyon, Rankin & Goetzel, P.C.

(57) ABSTRACT

Simulated network packets may be processed via a network processing pipeline. A packet processor may implement packet processing stages to process network packets received via physical network interface at the packet processor. A controller for the packet processor may provide simulated network packets to the packet processor for processing at the different packet processing stages, bypassing the physical network interface. Dummy simulated packets may be provided to or generated at the packet processor on behalf of the controller to be parsed, processed, and returned to the controller. Metadata simulated packets may be injected into the packet processing stages and recaptured in storage locations that are accessible to the controller.

20 Claims, 5 Drawing Sheets

SIMULATING NETWORK PACKETS IN A PACKET PROCESSING PIPELINE

BACKGROUND

Network communications are foundational to the operation of many different systems and devices. Large public networks, such as the Internet, or smaller private networks, such as corporate intranets, facilitate communications between different systems or devices, from clients of services that provide storage, computing, or data delivery to hosting internal web sites or network tools accessible to a small number of users. Such networks utilize large numbers of networking devices to facilitate the fast and reliable delivery of data, network packets, from one system to another.

Leveraging the power of network communications has greatly increased the demand upon networking devices to receive, process, and send network packets. In turn, this increased demand has led to a greater need to evaluate the performance of networking devices. For example, a network packet may be generated and sent to a networking device for processing so that the results of processing the network packet can be analyzed to evaluate the performance of the networking device. However, sending network packets to a networking device to perform diagnostic testing or other analysis may consume bandwidth or other resources at the networking device to process the diagnostic network packet instead of regular traffic. Therefore, techniques that provide for less impactful diagnostic testing of a networking device may be desirable.

Figure 1:
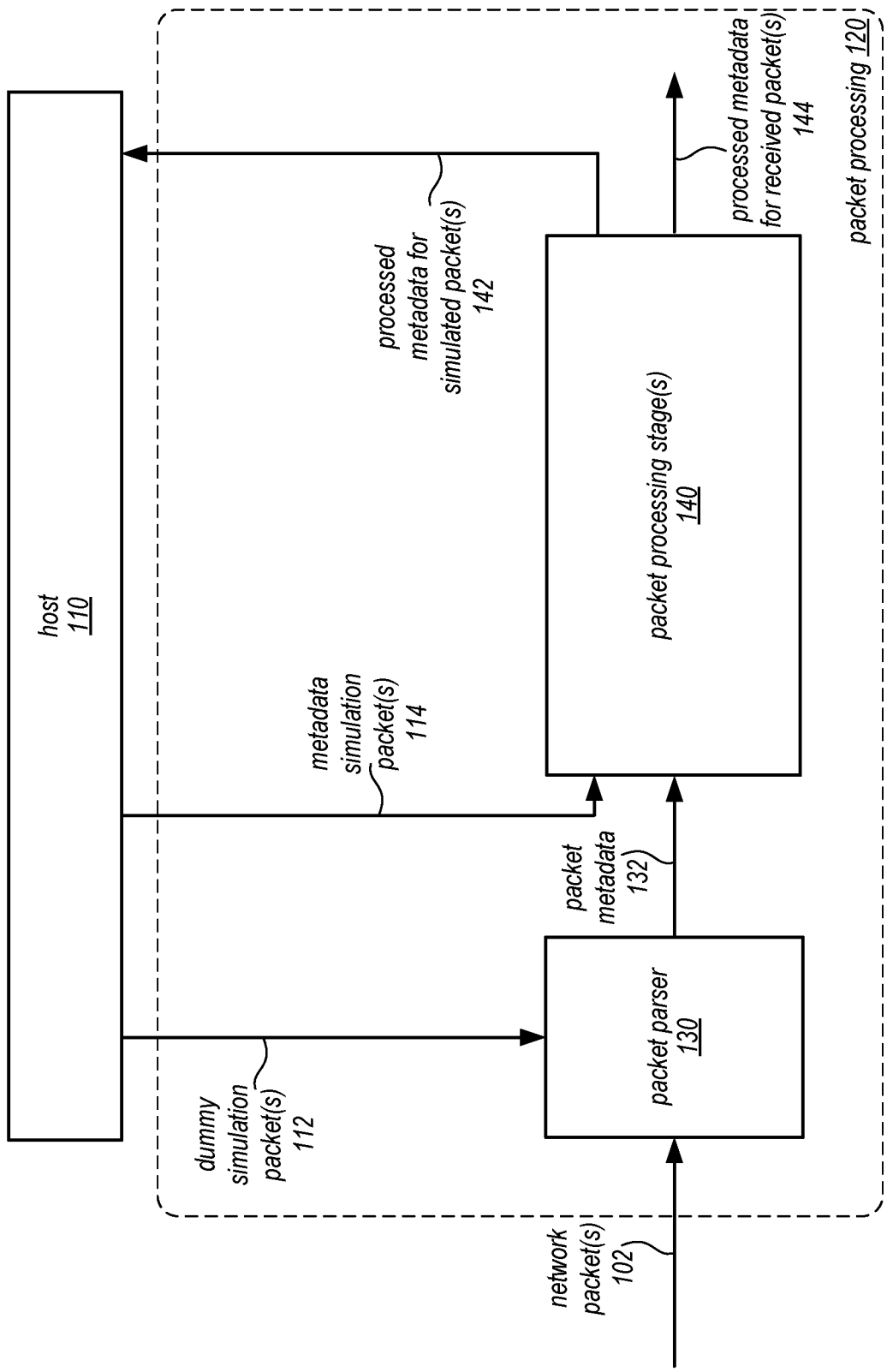
FIG. 1 illustrates a logical block diagram of simulating network packets in a packet processing pipeline, according to some embodiments.

While embodiments are described herein by way of example for several embodiments and illustrative drawings, those skilled in the art will recognize that the embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. As used throughout this application, the word "may" is used in a permissive sense (i.e., meaning having the potential to), rather than the mandatory sense (i.e., meaning must). Similarly, the words "include", "including", and "includes" mean including, but not limited to.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, paragraph (f), for that unit/circuit/component. Additionally, "configured to" can include generic structure (e.g., generic circuitry) that is manipulated by software or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On" or "Dependent On." As used herein, these terms are used to describe one or more factors that affect a determination. These terms do not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

The systems and methods described herein may implement simulating network packets in a packet processing pipeline. Network packets are packets of data (e.g., datagrams) sent across a network from a source networking device (e.g., a network interface card implemented at a computer or server) to a destination networking device. The network may include many other networking devices, such as various kinds of switches, routers, network bricks, or any other device capable of receiving, processing, and/or sending the network packets across links between the networking devices in the network.

The path or route which a network packet travels may be determined according to forwarding decisions made at various networking devices in a network. A switch, for instance, may receive a network packet and make forwarding decisions with respect to the content of information in the network packet, such as various packet header fields. Consider a network packet that includes a destination address formatted in accordance with Internet Protocol (IP). A forwarding route may be an address or portion of an address which if matching the destination address for the network packet, identifies forwarding decision(s) to be made with respect to the network packet, such as a next hop address. Once a forwarding decision is made, modifications to the packet may be performed, and the packet sent to a next networking device connected to the current networking device (or the networking packet may be dropped). Forwarding of the network packet may continue amongst the networking devices of a network until the network packet reaches the desired destination.

Forwarding decisions may be determined in one or more processing stages, such as destination resolution stages. Different lookup operations to determine actions to be performed with respect to a network packet may be identified for a network packet by reading different entries in different lookup tables associated with the destination resolution stages. For example, a destination resolution stage may be used to obtain information to initiate tunneling for a network packet, provide multipath lookups, obtain labels to add to a packet for multiprotocol label switching, determine a next hop address, perform fast re-route, or implement link aggregation.

Simulation of network packets may be implemented for packet processing pipelines to leverage the capabilities of the packet processing pipeline to process a simulated network packet. A simulated network packet may be a network packet that is not received at the packet processor from via a network connection (e.g. via an Ethernet port) but is initiated by a request from a host for the packet processor, such as a controller for the packet processor. Processing simulated network packets may offer many development and performance benefits. For example, during development and verification of a packet processor design, simulated network packet processing may allow for direct stimulus and observation of different operations or stages by software in simulation and in an FPGA emulation platform. Consider hard-to-create lookup scenarios for packet processing stages. Instead of generating and sending packets into a physical network interface that trigger the hard-to-create lookup scenarios, simulated packet processing may be implemented to directly simulate the scenarios on the packet processor without generating and sending a test packet. Different types of simulated network packets may also allow for more focused test and verification. Metadata simulated packets may be injected directly in to the processing pipeline, bypassing a parser component, so that verification can be done on the processing pipeline before the parser has been fully designed and verified.

Simulated packet processing also offers performance enhancements in operational settings. For example, during normal operation processing stages may be used to do routing lookups for an IP address leveraging the speed and efficiency of the hardware-based packet processing implementation. In some scenarios, a controller may want to determine routing destination information for a particular IP address (e.g., in order to program processing stages to handle mirrored packets). But in normal operation, dynamic routing protocols, such as open shortest path first (OSPF), are run and these protocols may cause routes to be added to and deleted from routing tables, causing updates to multipath tables (WCMP), tunnels, and link aggregations that would need to be applied based on the IP address being looked up, leading to situations where the routing destination information may be constantly changing. While a controller could attempt to do all of these look up operations, the burden on controller resources to execute such operations regularly would be great (since the tables are constantly changing and these lookups would be CPU intensive). However, if a controller were to simulate a network packet injection into the forwarding pipeline of a packet processor and capture the results of all of the lookups (e.g., by reading from registers that capture the processed simulated packet metadata), then the processing burden of the CPU could be shifted to the packet processor, which is optimized to perform those kinds of operations.

FIG. 1 illustrates a logical block diagram of simulating network packets in a packet processing pipeline, according to some embodiments. Packet processing 120 may be implemented as part of a packet processor in a network device that may be configured to route, forward, or otherwise facilitate the communication of different devices, systems or networks via network connections to the networking device, such as discussed below with regard to FIG. 2. Network packets 102 may be received at packet processing 120 via physical network interface (e.g., Ethernet port) for processing and forwarding with respective forwarding decisions made for the network packets by packet processing 120. For instance, received packet processing may implement various processing stages 140 and components like those of a packet processor discussed below with regard to FIGS. 3 and 4.

In addition to processing network packets 102 received via physical interfaces, packet processing 120 may also be leveraged to process simulated network packets on behalf of host 110. Host 110 may be a controller or other application executing on a processor of a host system (e.g., networking device 200 in FIG. 2). Host 110 may request the processing of simulated network packets at packet processing 120. Different types of simulated network packets may be processed. In some embodiments, dummy simulated network packets 112 may be processed. Dummy network packets 112 may be entire network packets (including a header and payload) that may be provided to packet processing 120 (or generated at a packet processor as discussed below with regard to FIG. 4). Dummy simulated packets 112 may be provided to packet parser 130, which may extract the packet metadata 132 for processing at packet processing stages. Metadata simulated network packets 114 may be metadata only for a network (excluding a payload) so that the metadata may be provided by host 110 for injection into packet processing stage(s) 140. (e.g., by writing the metadata to a storage component in a packet processor, such as a burst absorption buffer which then injects the metadata into packet processing stages 140).

Included as part of the metadata for simulated network packets may be an indication that the metadata is for a network packet, so that when the processed metadata is output from packet processing stages 140, metadata processed for simulated network packet(s) may be provided 142 back to host 110 without any further processing performed (without regard to the actions determined in the metadata). For example, capture registers may be implemented to store metadata processed metadata for metadata simulated packets 114. Host 110 may then read the metadata from the capture registers. Other examples or providing processed metadata for simulated packet(s) 142, are discussed below with regard to FIG. 4. For metadata that does not include the indication that the metadata is for a simulated packet, then the metadata may be processed as metadata for a received network packet 144. For example, forwarding actions determined as part of packet processing stage(s) 140 and indicated in the metadata, may be performed (e.g., drop the packet, trap the packet, forward the packet, etc.).

Please note that the previous description of a host, packet parser 130, packet processing stages 140 and packet processing 120 is not intended to be limiting but is merely provided as a logical illustration of simulating network packets in a packet processing pipeline. Different numbers of components or configuration of components may be implemented. For example, a packet generator may be implemented as part of packet processing 120 to generate dummy simulated packets.

This specification begins with a general description of a networking device, which may implement simulating network packets in a packet processing pipeline by a packet processor implemented as part of the networking device. Then various examples of a packet processor are discussed, including different components/modules, or arrangements of components/modules that may be implemented and which may receive, generate, and/or process simulated network packets. A number of different methods and techniques to implement simulated network packets in a packet processing pipeline are then discussed, some of which are illustrated in accompanying flowcharts. Various examples are provided throughout the specification.

Figure 2:
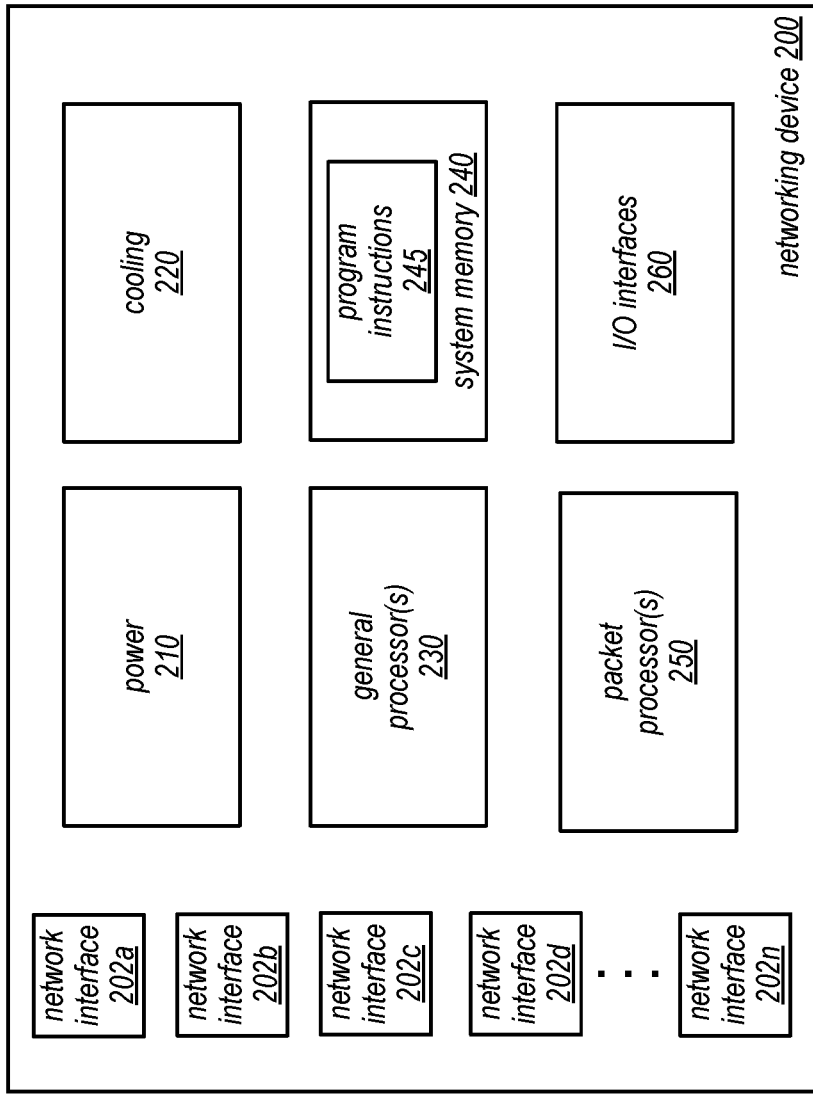
FIG. 2 is a logical block diagram illustrating a networking device that implements a packet processor, according to some embodiments.

FIG. 2 is a logical block diagram illustrating a networking device that implements a packet processor, according to some embodiments. Networking device 200 may be a networking device configured to route, forward, or otherwise facilitate the communication of different devices, systems or networks via network connections to the networking device. A networking device may provide electrical and logical network connections. Networking devices may operate utilizing data included in different OSI layers, such as layers 2 and 3 to make forwarding determinations (e.g., to send a network packet received from one source connected to the switch to another source connected to the switch). Please note that networking devices, such as a switch, in some contexts (e.g., when discussing layer 3 data) may be considered a type of router. Networking devices may also provide other services when facilitating communications, such as implementing network firewalls, network intrusion detection, and/or collecting metrics for performance analysis.

In at least some embodiments, networking device 200 may implement multiple network interfaces 202, which correspond to physical connections of different communication lines (e.g., twisted pair cables, coaxial cables, or fiber optic cables) connected to corresponding network interface ports. Network interfaces 202 may provide for different types, speeds, or other formats of network communication. For example, network interfaces 202 may provide different ports for 10 Gigabit, 40 Gigabit, or 100 Gigabit Ethernet cables. Many ports support multiple speeds, such as both 10 Gigabit and 100 Gigabit Ethernet connections.

Power 210 may be one or more power supplies that provide electricity to the various electrical components that draw upon power to perform operations (e.g., cooling 220, general processor(s) 230, system memory 240, packet processor(s) 250, and/or I/O interfaces 260. Cooling 220 may be one or more fan units implemented to circulate air and draw heat out of networking device 200.

Networking device 200 may include general processor(s) 230 which may include multiple cores (and which may be single or multi-threaded) coupled to a system memory 240 via an input/output (I/O) interface 260. Networking device 200 may be a uniprocessor system including one processor 230, or a multiprocessor system including several processors 230 (e.g., two, four, eight, or another suitable number). General processors 230 may be any suitable processors capable of executing instructions. For example, in various embodiments, processors 230 may be general-purpose or embedded processors implementing any of a variety of instruction set architectures (ISAs), such as the x86, PowerPC, SPARC, or MIPS ISAs, or any other suitable ISA. In multiprocessor systems, each of processors 230 may commonly, but not necessarily, implement the same ISA.

Networking device 200 includes one or more system memories 240 that are configured to store program instructions and data accessible by processor(s) 230. In various embodiments, system memories 240 may be implemented using any suitable memory technology, (e.g., one or more of cache, static random access memory (SRAM), DRAM, RDRAM, EDO RAM, DDR 10 RAM, synchronous dynamic RAM (SDRAM), Rambus RAM, EEPROM, non-volatile/Flash-type memory, or any other type of memory). System memory 240 may contain program instructions 245 that are executable by processor(s) 230 to implement various management functions and interfaces for networking device 200. In various embodiments, program instructions 245 may be encoded in platform native binary, any interpreted language such as Java™ byte-code, or in any other language such as C/C++, Java™, etc., or in any combination thereof.

In some embodiments, program instructions 245 may include instructions executable to implement an operating system (not shown), which may be any of various operating systems, custom or off the shelf operating systems. Any or all of program instructions 245 may be provided as a computer program product, or software, that may include a non-transitory computer-readable storage medium having stored thereon instructions, which may be used to program a computer system (or other electronic devices) to perform a process according to various embodiments. Program instructions 245 may also implement a controller that is configured to interface with packet processor(s) 250. For example, a controller may be configured to program memory devices with new or additional information (e.g., update next hop tables, pointer tables, action tables, insert or remove forwarding routes, etc.). A controller may also perform various statistical analysis or evaluations to be sent as statistic or other forms of network packets generated by packet processors 250 or request the simulation of network packets, as discussed below.

A non-transitory computer-readable storage medium may include any mechanism for storing information in a form (e.g., software, processing application) readable by a machine (e.g., a computer). Generally speaking, a non-transitory computer-accessible medium may include computer-readable storage media or memory media such as magnetic or optical media, e.g., disk or DVD/CD-ROM coupled to computer system via an I/O interface. A non-transitory computer-readable storage medium may also include any volatile or non-volatile media such as RAM (e.g., SDRAM, DDR SDRAM, RDRAM, SRAM, etc.), ROM, etc., that may be included in some embodiments of computer system as system memory or another type of memory. In other embodiments, program instructions may be communicated using optical, acoustical or other form of propagated signal (e.g., carrier waves, infrared signals, digital signals, etc.) conveyed via a communication medium such as a network and/or a wireless link, such as may be implemented via network interface.

Networking device 200 may implement one or multiple I/O interface(s) 260 to provide access to networking device 200 (e.g., to perform various switch management operations). In one embodiment, I/O interfaces 260 may be configured to coordinate I/O traffic between processor 230, system memory 245, packet processor(s) 250, and any peripheral devices in the system. In some embodiments, I/O interfaces 260 may perform any necessary protocol, timing or other data transformations to convert data signals from one component (e.g., system memory 245) into a format suitable for use by another component (e.g., processor 230). In some embodiments, I/O interfaces 260 may include support for devices attached through various types of peripheral buses, such as a variant of the Peripheral Component Interconnect (PCI) bus standard or the Universal Serial Bus (USB) standard, for example. In some embodiments, the functions of I/O interfaces 260 may be split into two or more separate components, such as a north bridge and a south bridge, for example. Also, in some embodiments, some or all of the functionality of I/O interfaces 260, such as an interface to system memory 240, may be incorporated directly into processors 230.

Figure 3:
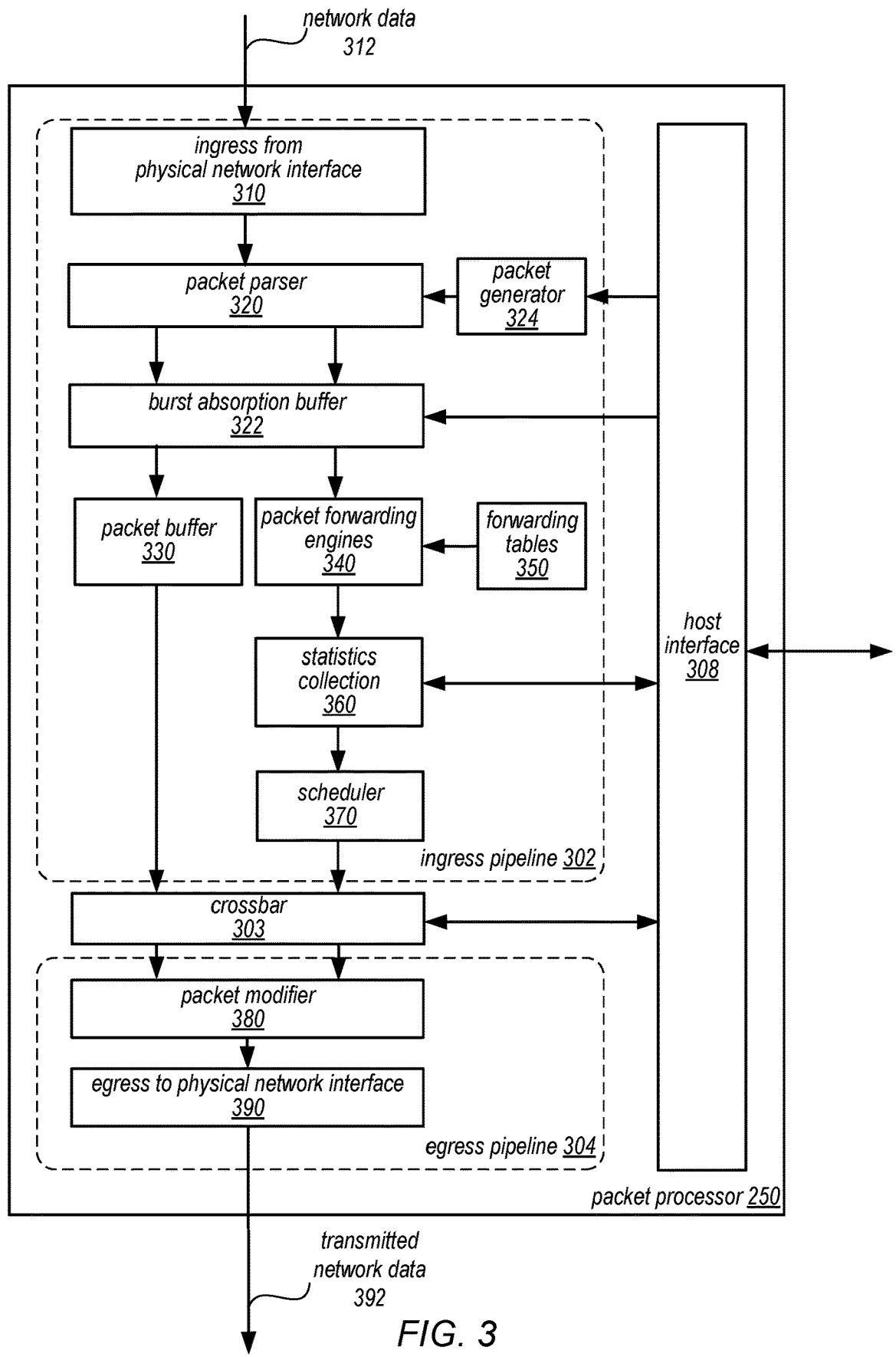
FIG. 3 is a logical block diagram illustrating a packet processor that implements simulating network packets in a packet processing pipeline, according to some embodiments.

As noted in FIG. 2, one or multiple packet processors 250 may be implemented to process data received via network interface(s) 202 at networking device 200. Packet processor(s) 250 may be implemented as dedicated hardware to perform various stages of packet processing for networking device 200. For example, packet processor(s) 250 may be implemented as an application specific integrated circuit (ASIC), field programmable gate array (FPGA), system-on-a-chip (SoC), or other dedicated circuitry that performs packet processing. Packet processor(s) 250 may also be implemented as a software-based packet processing pipeline to perform various stages of packet processing for networking device 200 (e.g., via program instructions executing on one or more general processors 230). Packet processor(s) 250 may be assigned to one or multiple network interface(s) 202, performing dedicated processing of network data received via the assigned network interface(s) 202. FIG. 3 is a logical block diagram illustrating a packet processor that implements simulating network packets in a packet processing pipeline, according to some embodiments. Note that a packet processor may sometimes be referred to as a "network switch" (e.g., when implemented as a switch-on-a-chip). However, the term "network switch" is also commonly used to describe networking hardware, such as a switching hub, that may implement one or multiple packet processors as well as other hardware (such as discussed above with regard to networking device 200 in FIG. 2). Therefore, the term "packet processor" has been used herein to prevent confusion when referring to dedicated hardware for performing packet forwarding.

Packet processor 250 may implement multiple processing pipelines to output a processed network packet. For example, as illustrated in FIG. 3, ingress pipeline 302 and egress pipeline 304 may be implemented to provide forwarding of network packets as part of the data plane so that forwarding may be performed without software-based techniques. Ingress pipeline 302 may include different components, units, or stages, such as an ingress unit from a physical network interface 310, a packet parser 320, a packet generator 324, a burst absorption buffer 322, a packet buffer 330, packet forwarding engines 340, statistics collection 360, and scheduler 370. Ingress pipeline 302 may also access forwarding tables 350 and other packet routing information. Egress pipeline 304 may include a packet modifier 380 with access to other packet modification data, and an egress unit to physical network interface 390. Packet processor 250 may implement a host interface 308 to communicate with a controller implemented on general processors(s) 230.

As data is received from network interfaces, ingress unit 310 may provide a physical layer (PHY) interface and Ethernet Media Access Control (MAC) layer interface. These interfaces may evaluate a stream of network data 312 (e.g., bit stream) received at packet processor 250 to detect valid streams and segment the stream into datagrams (e.g., packets/frames). For instance, the PHY layer may receive and transmit data across physical connections (e.g., such as electrical signals received over twisted pair or coaxial cable or optical signals received over optical fiber) at network interfaces 202. The PHY layer may implement different techniques dependent on the speed or type of network interface configured (e.g., Ethernet 10BASE-T, 100BASE-TX, and 1000BASE-T forms), such as encoding, multiplexing, synchronization, clock recovery and data serialization. Various signaling standards, such as IEEE 802.3, may govern the performance of the PHY layer consistent with the open systems interconnection (OSI) model for communications. The MAC layer may delimit frames and packets from the stream of data. Error checking may also be implemented at the MAC layer, checking for different errors, such as frame check sequence (FCS), inter-frame gap enforcement, and frame preambles.

Packet parser 320 may receive a network packet from ingress 310 and separate the packet header from the packet payload. The payload of the packet may be stored in packet buffer 330. Packet parser 320 may parse the packet header to determine and/or extract data for making a forwarding decision for the packet. For example, packet parser 320 may extract different layer headers (e.g., L2, L3, and L4 headers) included in an Internet Protocol (IP) version 4 packet, such as the source MAC address, the destination MAC address, the source IP address, the destination IP address, and port numbers. The extracted metadata may then be utilized to perform lookups to make forwarding decisions at packet forwarding engines 340. In some embodiments, packet parser 320 may determine different hash key values to determine an entry in pointer tables in different destination resolution stages (e.g., a tunnel initiation stage, multipath stage, or link aggregation stage) from various packet header fields (e.g., fields from layers 1, 2, 3, and 4 of the network packet and bits from the UDF) either for received network packets or network packets generated by packet processor 250, in some embodiments. Hash key values generated for a network packet can be generated for a specific type of network packet (e.g., IP or MPLS) and may be generated according to one of many different hash functions (e.g., CRC16-CITT and CRC16-IBM). Packet parser 320 may also receive a network packet generated by packet generator 324. Packet generator 324 may generate various kinds of network packets, including dummy simulation packets according to the techniques discussed below with regard to FIG. 4 in response to requests from a controller received at packet generator 324 via host interface 308.

In at least some embodiments, ingress pipeline 302 may implement burst absorption buffer 322 to arbitrate the ingestion of network packets from parser 320 into packet buffer 330 and packet forwarding engines 340. As discussed below with regard to FIG. 4, burst absorption buffer may also receive metadata via host interface 308 for metadata simulated network packets for injection into packet forwarding engines 340. Note that other buffers or components could perform a similar operation and therefore injection metadata simulated network packets is not intended to be limited to storing the metadata in a burst absorption buffer.

Packet forwarding engines 340 may access data stored in forwarding tables 350 to make forwarding and tunneling decisions for the network packet based on information in the packet header (e.g., including source and destination addresses) extracted by packet parser 320. For example, packet forwarding engines 340 may perform lookups for data in layer 2 (L2) portions of the packet to perform L2 forwarding. Similarly, packet forwarding engines 340 may also perform lookups for data in layer 3 (L3) portions of the packet to perform L3 forwarding, in some embodiments. For example, internet protocol (IP) headers for the packet may be evaluated with respect to entries in tables, such as a routing or next hop table, to determine forwarding to be performed. In at least some embodiments, packet forwarding engines 340 may implement one or more destination resolutions stages (e.g., as part of a destination resolution pipeline) to determine forwarding decisions for network packets. For example, various destination resolution stages may include such as a tunnel initiation stage, multipath stage, multiprotocol label switching (MPLS) outer label stage, next hop address stage, fast re-route stage, and link aggregation stage. As packet forwarding engines 340 make forwarding decisions about the packet (e.g., for L2, L3 and/or tunneling), the decisions are maintained as packet metadata. The packet metadata may be provided to scheduler 370 for scheduling determinations.

As discussed above, forwarding tables 350 may be implemented in one or multiple storage devices, such as various memory devices (e.g., a CAM, such as a TCAM, and/or random access memory, such as SRAM) to store table data for performing different routing decisions. Tables may include a VLAN table, MAC address table, routing table, adjacency table, next hop table, tunnel start table, tunnel termination table, and/or actions table. Each of these different tables may be utilized to retrieve or determine packet forwarding decisions, tunneling decisions, and associated modifications that may need to be made to network packets.

In at least some embodiments, ingress pipeline 302 may implement statistics collection 360. Statistics collection 360 may collect statistics based on the network packets processed through ingress pipeline 302. For example, various counters may be maintained for events occurring during processing by packet forwarding engines 340 (e.g., such as forwarding table 350 hits including VLAN table, MAC address table, routing table, adjacency table, next hop table, tunnel start table, tunnel termination table, and/or actions table). Statistics collection 360 may also collect statistics and information concerning traffic flow and network visibility through packet processor 250, for example, by detecting, measuring, and exporting flow cache entries for large traffic flows, by sampling, aggregating, and exporting snippets (e.g., 128 bytes) from network packets from small traffic flows, and/or determining the number of unique traffic flows. In at least some embodiments, statistics collection 360 may provide statistic packets (or information to generate statistics packets that encapsulate some of the collected statistics) to forward as network packets generated by packet processor 250. Statistics collection 360 may also be accessible to a controller via host interface 308 to provide the collected statistics and other information based on the packets processed through ingress pipeline 302.

Scheduler 370 may control the buffering of packets and scheduling of operations within packet processor 250. For example, scheduler 370 may implement a memory management unit to allocate available memory segments in packet buffer 330 to store packets to be buffered. If a packet needs to be buffered (e.g., because the egress interface is congested), scheduler 370 may store the packet in a private pool of memory assigned to a particular physical interface port for the packet or shared pools of memory to store packets (e.g., if the private pool of memory is full). Scheduler 370 may also implement a memory management unit to dequeue packets from packet buffer 330 for final processing and egress. Scheduler 370 may provide the appropriate metadata for a packet to modifier 380. In some embodiments, packets from packet buffer 330 and packet metadata from scheduler 370 may be moved from ingress pipeline 302 to egress pipeline 304 via a crossbar 303. Crossbar 303 may, for example, be implemented by one or more destination rings to transmit a network packet from the ingress pipeline 302 via egress pipeline 304 to a desired destination port. In some embodiments, crossbar 303 may override the forwarding decisions for dummy simulated network packets and forward the dummy simulated network packets to the controller via host interface 308. Scheduler 370 may also schedule the egress of mirrored/sampled versions of network packets identified by forwarding engines 340).

Host interface 308 may implement a peripheral component interface (PCI) based interface, such as PCIe, to facilitate communication between packet processor 250 and general processor(s) 230 and system memory 240. As part of the PCI-based interface, host interface may implement a parallel input/output (PIO) interface to allow a controller to read and write to various components of packet processor 250, including requests to process simulated network packets. Host interface 308 may also implement a direct memory access (DMA) engine to perform DMA writes and reads to system memory 240 via a DMA channel.

Network packets that have passed through ingress pipeline 302 may be scheduled or released from packet buffer 330 for modification, reassembly and egress as part of egress pipeline 304. Packet modifier 380 may be implemented to modify packet headers based on the routing decisions indicated in the packet metadata determined by packet forwarding engines 340. For example, if tunneling is enabled for a packet, packet modifier 380 may create and insert the appropriate tunnel header in order to encapsulate at least a portion of the packet to implement a tunneling protocol. Packet modifier 380 may also perform modifications to other data in the packet header. Once the modified packet has been reassembled, egress unit to physical network interface 390 may utilize the physical layer (PHY) interface and the Ethernet Media Access Control (MAC) layer interface to transmit network packets as network data 392 via the appropriate physical connection (e.g., coaxial, twisted pair, or optical cable).

Network packet simulation may be implemented to provide diagnostic feedback for individual components of packet processor(s) 250, such as design development testing or design qualification/verification, as well as to leverage the speed of the packet processor to perform different operations that would instead require a controller to consume time/resources determining. For example, a dummy network packet may be requested by the controller in scenarios where the controller needs to perform a next hop lookup. Instead of emulating the same lookup techniques and processing actions performed by the packet processor in the host CPU and memory, the controller may request the generation of a dummy simulation packet that inserts the destination IP address of the next hop lookup so that an L3 forwarding decision based on the destination IP address can be determined using the packet processor and returned to the controller. In this way, the controller can spend time performing other tasks (e.g., resolving other interrupts, performing other management functions, etc.) instead of performing a task that the packet processor is optimized to perform.

Figure 4:
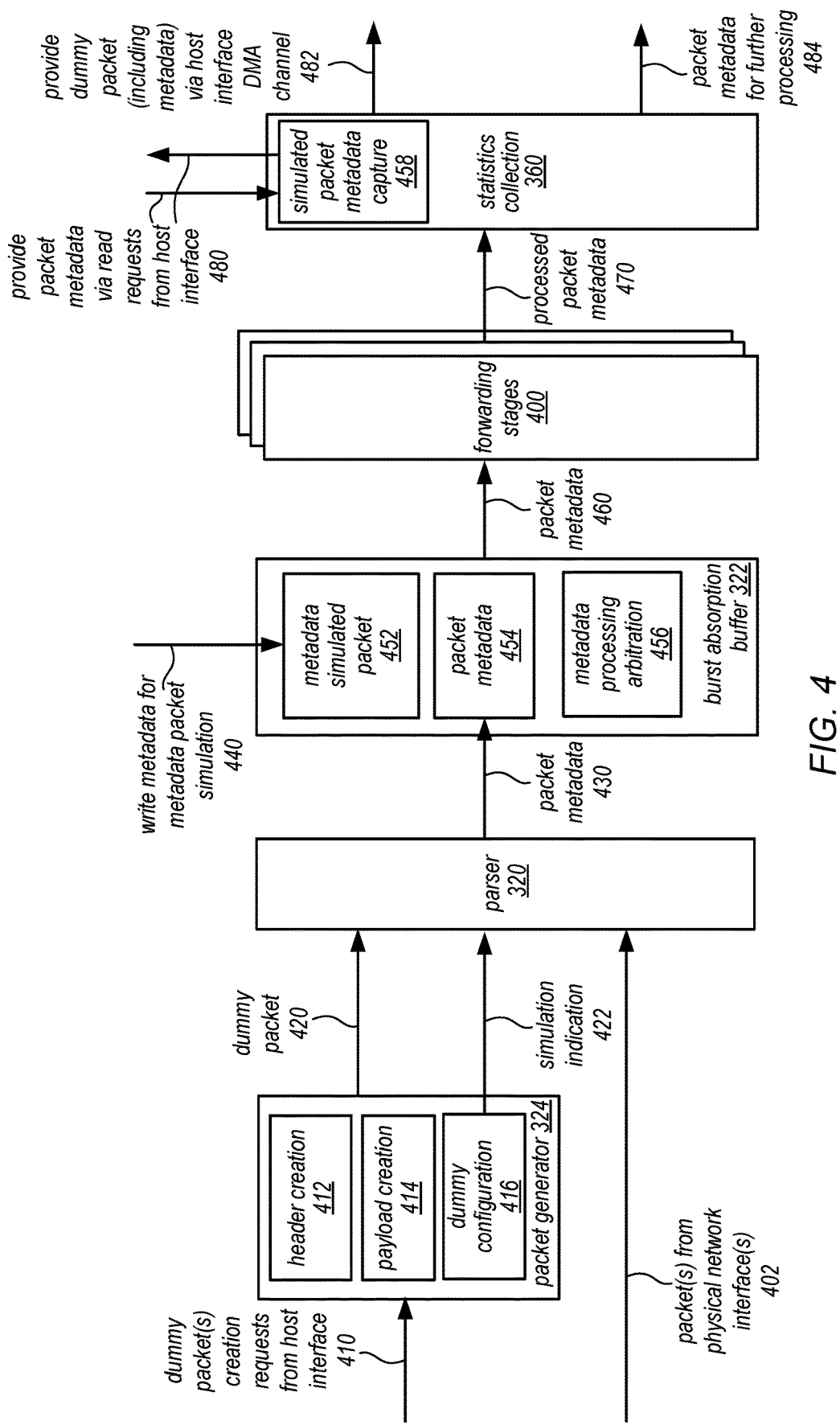
FIG. 4 is a logical block diagram illustrating dummy simulation packets and metadata simulation packets injected into a packet processing pipeline that also processes network packets received via a physical network interface, according to some embodiments.

FIG. 4 is a logical block diagram illustrating dummy simulation packets and metadata simulation packets injected into a packet processing pipeline that also processes network packets received via a physical network interface, according to some embodiments. As illustrated in FIGS. 3 and 4, packet(s) from physical network interfaces 402 (e.g., network packets received via interface 310) may be provided to a packet parser 320 before providing the extracted metadata 430 to other stages in the packet processor for further processing (e.g., burst absorption buffer 322, forwarding stage(s) 400, and statistics collection 360) and output for further processing and/or forwarding 484. In addition to processing these non-simulated network packets, processing for simulated network packets may also be initiated. As noted in FIG. 1, different types of simulated network packets may be implemented. Dummy simulation packets may simulate an entire network packet, including a payload of dummy data. Metadata simulation packets may simulate the metadata of a network packet, excluding a payload.

Different simulation packets may be optimal for different use cases. For instance, metadata simulation packets may be provided without the need to have metadata extracted by parser 320. In development testing, scenarios, other portions of the packet processing pipeline can be tested and evaluated without having to rely upon a complete and fully functional parser, allowing for parallel development of both the parser and other stages in the packet processing pipeline. Moreover, metadata packet simulations may be implemented so as not to interfere with the processing of network packets received via a physical network interface 402 (e.g., by injecting the metadata simulated packets into the processing pipeline during bubble cycles when a network packet 402 is not ready to be processed). Dummy packets may be generated where the entire forwarding pipeline of the packet processor (e.g., including parser 320) needs to be evaluated or when lookup operations using a dummy packet may be performed to leverage the speed at which the results of dummy packet processing, providing metadata via a host interface DMA channel, as indicated at 482.

In at least some embodiments, packet generator 324 may be configured to generate dummy simulated packets. For example, a request 410 to create a dummy packet may be received via host interface 308 at packet generator 324. The request may specify the location of or indication that metadata for the dummy packet is stored in a location in a storage component, such as a memory device (the controller having written the desired metadata, such as different metadata fields to include in the dummy simulation packet to the storage component). Packet generator 324 may implement header creation 412 to generate a header for the network packet formatted according to the type of dummy network packet to be generated (e.g., L2, raw IP, UDP, TCP, IP-in-IP, GRE, MPLS IPv4, and/or IPv6 packets). While header information may be supplied by a controller, header creation 412 may alter, modify, rewrite, or otherwise change some header field values (e.g., to random values). Similarly, packet generator 324 may implement payload creation 414 to generate dummy payload data for the dummy simulated packet. For example, payload creation 414 may randomly determine a payload size and generate random data for the payload. Packet generator 324 may provide dummy packet 420 to packet processor to inject the dummy simulated packet into the packet processing pipeline. In addition to providing the dummy packet 420, packet generator 416 may implement dummy configuration 416 to provide a simulation indication 422 to parser 320. Simulation indication may indicate to parser 320 to include an indication that the metadata extracted from dummy packet 420 is for a simulated packet (as well as other indications for the simulated packet, such as whether statistics collection will include the simulated network packet).

As noted above in FIG. 3, burst absorption buffer 322 may be implemented to hold packet metadata 454 parsed from packets 402 and dummy packets 420 for injection to forwarding stages 400. Additionally, burst absorption buffer 322 may implement storage component(s) to hold a metadata simulated packet 452, such as a memory device or storage registers. To request a metadata simulated packet, a controller may write metadata 440 for the metadata simulated packet to the storage components in burst absorption buffer that hold simulated metadata packet 452 (e.g., via host interface 308). The metadata may include the metadata which is extracted by parser 320 from packets, so that when processing metadata simulated packets, no difference in the source of the metadata may be distinguished by forwarding stages 400. Burst absorption buffer 322 may implement metadata processing arbitration 456 to select metadata for injection into forwarding stages 400. For example, first-in-first-out (FIFO) selection technique for packets received into the buffer may be implemented or a round robin selection technique to select metadata for packet from different sources (e.g., received via different physical network interfaces). In at least some embodiments, metadata processing arbitration 456 may treat metadata for dummy simulation packets the same as packets received via physical network interfaces, while metadata simulation packets may be selected for injection when a bubble (e.g., an available cycle) in the pipeline occurs.

Once selected, packet metadata 460 is injected into forwarding stages 400. Forwarding stages 400 may implement a variety of different forwarding engines. For example, a multiprotocol label switching stage may perform a label lookup for an MPLS packet to determine a forwarding action. Forwarding actions may include actions indicating that the network packet is to be mirrored, dropped, trapped, tunneling enabled, etc. Similarly, an L2 lookup stage may perform a lookup for L2 packets based on destination MAC address to determine a forwarding action. An L3 stage may perform a lookup in a routing table for L3 network packets, based on IP network addresses to determine a forwarding action. Another stage may be an access control list stage (which may be used to process different types of network packets, including MPLS, L2, and L3 network packets). The access control list stage may apply various forwarding rules to network packets, including rules that identify some network packets for mirroring, tunneling, dropping, etc.

Different destination resolution stages may also be implemented as part of forwarding stages 400. For example, a multipath stage may provide weighted cost multipath (WCMP) to distribute network traffic amongst multiple valid paths in a network as part of a load-balancing mechanism for network packets. Paths may be selected based on a hash of data in the generated network packet for the generated network packet. The hash values may be determined by applying a hash function to a field taken from header data in a generated network packet (e.g., an L4 field such as source UDP). A next hop address stage may provide entries describing a next hop address (which may be a directly connected host to the networking device or an indirectly connected subnet) for different network packets corresponding to various forwarding routes (e.g., as may be pointed to by an L3 or MPLS forwarding engine or by an access control list rule) or other destination resolution stage (e.g., the multipath stage). Entries in the next hop address stage may include an indication as to whether the entry is valid, an entry for address resolution protocol (ARP), a destination MAC address index, an indication as to whether an egress virtual local area network (VLAN) is valid, an egress VLAN, an egress logical port indication, and an indication of the maximum transmission unit (MTU). A link aggregation stage may enable sharing of bandwidth across multiple ports. To enable this feature, link aggregation stage may be implemented much like the multipath stage, aggregating packets on links according to a hash value. In some embodiments, the link aggregation stage provides an even distribution of traffic across links. While in other embodiments, weighted distribution may be programmed by the controller across links.

The results of forwarding stages 400 may be reflected in the processed metadata, by changing the metadata for the packet, identifying forwarding actions, destinations, operations/lookups performed, etc. In at least some embodiments, processed metadata 470 may be provided to a stage or component, such as statistics collection 360, which may evaluate the output metadata to discover whether the metadata includes an indication that the metadata is for a simulated network packet. For example, statistics collection 360 may evaluate a location or signal in metadata for a packet that is reserved for the simulation indication. The indication may also identify whether the simulated packet is a dummy simulated packet or a metadata simulated packet. If for a metadata simulated packet, the processed metadata for the metadata simulated packet may be captured in storage components implementing simulated packet metadata capture 458. Simulated packet metadata capture 458 may be accessed by a controller via host interface 308 by read requests 480 to obtain the processed metadata for the simulated packet. In at least some embodiments, the controller may poll an indicator in simulated packet metadata capture storage components (e.g., a bit location) that is set when metadata is captured. In this way, the host may determine when new metadata for a metadata simulated packet has been capture and may then begin read requests 480. In other embodiments, an interrupt or signal may be provided to the controller to indicate the presence of captured metadata.

Dummy simulation packets may be provided from statistics collection 360 via a DMA channel 482 (which may provide other collected statistics to the controller). For example, the dummy simulation packet indicator may be discovered in the network packet, automatically direct the dummy packet to be trapped (without regard to the action for the dummy simulation packet indicated in the metadata). Trapped packets may be written using a DMA channel 482 to a memory accessible to the controller (e.g., system memory 240).

Statistics collection 360 may also evaluate indications in the metadata that identity whether a simulated network packet is to be included in statistics collected by statistics collection 360. For example, if statistics collection is disabled for a simulated network packet, then packet counters in statistics collection that are incremented based on processed packets may not increment when metadata for the simulated packet is received at statistics collection stage 360.

The examples of simulating network packets in a packet processing pipeline as discussed above with regard to FIGS. 2-4 have been given in regard to a packet processor implemented as part of a networking device. Note that various other types or configurations of networking devices that implement packet processors or devices with packet processing pipelines may implement these techniques. Moreover, different configurations of the various modules, components, or stages within a packet processor may implement initiating processing of simulated network packets that avoid using physical network interfaces for injecting the simulated network packets. In addition to examples given above, the techniques discussed below with regard to FIGS. 2-4 may be also implemented using the various components discussed above as well as different types of systems or devices that perform packet processing.

Figure 5:
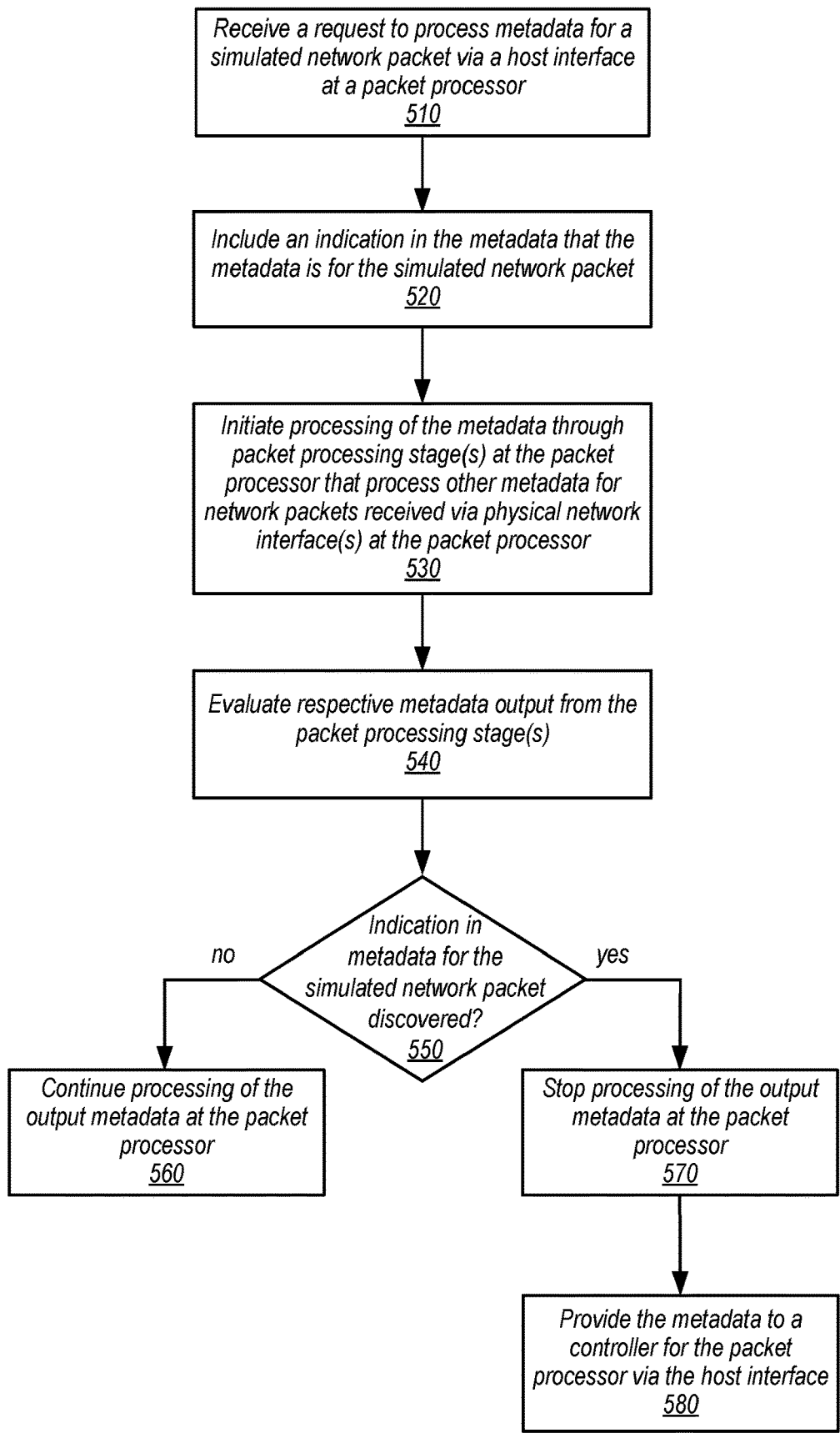
FIG. 5 is a high-level flowchart illustrating various methods and techniques to implement simulating network packets in a packet processing pipeline, according to some embodiments.

FIG. 5 is a high-level flowchart illustrating various methods and techniques to implement simulating network packets, according to some embodiments. As indicated at 510, a request to process metadata for a simulated network packet may be received via a host interface at a packet processor. Different types of simulated network packets may be used. In some embodiments, the request to process metadata may be a request to initiate generation of a dummy simulation packet that includes both metadata and a payload to be processed, as discussed above with regard to FIGS. 1 and 4, which would generate metadata as part of the dummy simulation packet to be processed. In some embodiments, dummy network packets may be generated at a controller for the packet processor and provided directly to a parser or other component that extracts metadata from network packets while still bypassing the physical network interface(s) (e.g., Ethernet ports) of the packet processor. Requests to process metadata for a simulated network packet may also include requests that provide metadata without a packet payload to the packet processor (e.g., metadata simulated network packets), such as discussed above with regard to FIGS. 1 and 4. Registers, memory, buffers, or other components may hold the received metadata simulated network packet for injection into packet processing stages.

As indicated at 520, an indication may be included in the metadata that the metadata is for the simulated network packet, in various embodiments. For example, metadata extracted or evaluated in headers of network packets may be provided to packet processing stages at the packet processor in a format that allows the different packet processing stages to process or act upon certain metadata field or as separate signals to the appropriate stage for processing the metadata. An L2 forwarding stage, for instance, may evaluate the source and destination MAC address in the metadata by evaluating a source MAC address and destination MAC address signals received from a parser or other prior packet processing stage. Likewise, the indication that the metadata being processed is for the simulated network packet may be included in a location in a metadata format or signal for the simulated network packet indication.

In addition to including an indication that the metadata is for a simulated network packet, other indications may be included in the metadata to change processing for simulated network packets. Statistics collection that is implemented for processing network packets generally may be enabled or disabled for simulated network packets by including an indicating that statistics collection is enabled or disabled.

Other indications may include indications that specify or select or exclude particular portions of the processed metadata to capture or provide for the simulated packet, indications that specify whether the simulated network packet is to be dropped without reporting any metadata for the simulated network packet, or any other action or operation that may be performed with respect to processed network packets.

As indicated at 530, processing of the metadata through packet processing stage(s) at the packet processor that also perform packet processing on metadata for network packets received via physical network interface(s) at the packet process may be initiated, in some embodiments. For example, selection or arbitration schemes that choose which network packet to process (in scenarios where multiple network packets may be ready for processing via the packet processing stages, such as packet processors that process packets received from multiple physical network interfaces) may be implemented to determine when to initiate processing of the metadata. For example, the metadata may be written to a buffer, such as the burst absorption buffer discussed above with regard to FIG. 4, from which metadata for network packets is selected for injection into stages in the packet processing pipeline. In at least some embodiments, simulated network packets may be treated using a different selection scheme. For example, for metadata simulated network packets, injection of the metadata may be limited to bubbles in the processing pipeline (when no other packet metadata is ready to be injected).

Once initiated, processing of the metadata for the simulated network packet may be performed as if the metadata were for a network packet that was received via a physical network interface. Thus, the various packet processing stages, such as Multiprotocol Label Switching, L2 forwarding, L3 forwarding, access control list evaluation, tunneling, multipath selection, link aggregation, action arbitration, data verification, and/or statistics collection, may ignore the simulated packet indication(s) included in the metadata. In some stages, such as statistics collection stages, indications such as the enable or disable indication for statistics collection for the metadata may be evaluated and used to determine whether or not the metadata will be counted or otherwise included in collected statistics. As respective metadata processed through the packet processing stages is output from the packet processing stage(s), as indicated at 540, the output metadata may be evaluated to identify whether the output metadata includes the indication that the metadata is for the simulated network packet. If not, then processing of the output metadata may continue at the packet processor 560. For example, the action determined for the network packet, such as whether to drop, trap, or forward the network packet may be performed. If, however, the indication in the metadata identifying the metadata for the simulated network packet is discovered (e.g., by evaluating the appropriate metadata signal or location), then processing of the output metadata may be stopped at the packet processor, as indicated at 570. For example, the metadata may be trapped or captured in storage components, such as a memory device or registers.

As indicated at 580, the metadata for the simulated network packet may be provided to a controller for the packet processor via the host interface. For example, in some embodiments, a host interface may facilitate read requests (e.g., via a Parallel I/O interface implemented as part of the host interface) to provide the controller with read access to a storage component, such as a memory location or register, that stores the capture metadata. In some embodiments, other communication techniques may be implemented, such as providing a DMA channel that allows the metadata (and possibly other data, such as an entire dummy packet) to be written directly to a memory accessible to the controller (e.g., system memory accessible to a processor executing the controller).

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

Various ones of the methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Boundaries between various components and operations are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of embodiments as defined in the claims that follow.

What is claimed is:

1. A networking device, comprising:
   a plurality of network interfaces corresponding to physical connections to the networking device, wherein the plurality of network interfaces provide for network communication between the networking device and one or more other devices;
   a packet processor, comprising different packet processing stages in the packet processor to process network packets received via the plurality of network interfaces;
   a host processor;
   a memory;
   wherein the host processor is configured to write, to a storage component implemented within the packet processor, metadata for a simulated network packet, wherein the simulated network packet is not received via one of the plurality of network interfaces in order to simulate a network packet without a payload and without sending the network packet to the networking device, wherein the packet processor receives the metadata for the simulated network packet via one or more other interfaces instead of the networking device receiving the network packet with the metadata and the payload via the plurality of network interfaces, wherein, in writing the metadata to the storage component, the host processor bypasses a packet parser that extracts respective metadata from the network packets to separate the respective metadata from respective payloads of the network packets such that the metadata is written to the storage component without being extracted by the packet parser, and wherein the packet parser is upstream of the storage component;

wherein the packet processor is configured to:
include an indication in the metadata for the simulated network packet that indicates that the metadata is for the simulated network packet;
inject the metadata into the different packet processing stages of the packet processor;
identify metadata output from the different packet processing stages as the metadata for the simulated network packet according to the indication included in the metadata; and
write the metadata output to another storage component implemented within the packet processor;

wherein the host processor is configured to read, via the one or more other interfaces, the metadata output for the simulated network packet from the another storage component.

2. The networking device of claim 1, wherein to inject the metadata into the different packet processing stages of the packet processor, the packet processor is configured to identify an available cycle for injection into the different packet processing stages, wherein the metadata is injected in the available cycle.

3. The networking device of claim 1, wherein the packet processor further comprises a statistics collection stage that collects statistics based on network packets processed in the different packet processing stages, and wherein the packet processor is further configured to:
include in the metadata a different indication that statistics collection is disabled for the simulated network packet;
determine, at the statistics collection stage, from the different indication in the metadata that statistics collection is disabled for the simulated network packet; and
exclude the simulated network packet from the statistics collected at the statistics collection stage.

4. The networking device of claim 1, wherein the host processor is further configured to poll to the packet processor to detect arrival of the metadata output, wherein the read of the metadata output is performed in response to the detection of the arrival of the metadata output.

5. A method, comprising:
receiving, via a host interface at a packet processor included in a device and from a controller for the packet processor, a request to process metadata to simulate a network packet without providing a payload to the packet processor instead of the device receiving the network packet with the metadata and the payload via a network interface corresponding to a physical connection to the device, wherein the network interface provides for network communication between the device and one or more other devices, wherein, based at least in part on the request to process the metadata, a storage component implemented within the packet processor receives the metadata via a writing operation that bypasses a packet parser that extracts respective metadata from network packets to separate the respective metadata from respective payloads of the network packets such that the metadata is written to the storage component without being extracted by the packet parser, and wherein the packet parser is upstream of the storage component;
including, by the packet processor, in the metadata an indication that the metadata is for the simulated network packet;
initiating, by the packet processor, processing of the metadata through a packet processing stage at the packet processor that processes other metadata for network packets received via the network interface;
upon completing the packet processing stage, evaluating, by the packet processor, metadata output from the packet processing stage to determine that the metadata output is the metadata for the simulated network packet according to the indication in the metadata; and
in response to determining that the metadata output is the metadata for the simulated network packet:
stopping further processing of the metadata at the packet processor; and
providing the metadata, via the host interface, to the controller for the packet processor.

6. The method of claim 5,
wherein the storage component comprises a buffer;
wherein receiving the request to process the metadata for the simulated network packet comprises detecting writing, by the controller via the host interface, the metadata in the buffer implemented at the packet processor; and
wherein initiating processing of the metadata through the packet processing stage at the packet processor comprises injecting the metadata from the buffer into the packet processing stage.

7. The method of claim 6, further comprising identifying an available cycle for injecting the metadata into the packet processing stage, wherein the metadata is injected in the available cycle.

8. The method of claim 6, wherein providing the metadata to the controller for the packet processor comprises writing the metadata to a plurality of different registers accessible to the controller via the host interface.

9. The method of claim 8, further comprising polling, by the controller, to detect the arrival of the metadata in the plurality of different registers, and wherein the method further comprises reading, by the controller, the plurality of different registers to obtain the metadata for the simulated network packet at the controller.

10. The method of claim 5, wherein:
the request to process the metadata to simulate the network packet is a first request received at the packet processor via the host interface; and
the method further comprises:
receiving, via the host interface at the packet processor, a second request, to process metadata for a dummy simulated network packet; and
parsing, using the packet parser, the dummy simulated network packet to extract metadata for the dummy simulated network packet.

11. The method of claim 10, further comprising:
storing the metadata for the dummy simulated network packet along with metadata for other received network packets in a buffer; and
initiating processing of the metadata for the dummy simulated network packet through the packet processing stage comprises selecting the metadata for the dummy simulated network packet according to an arbitration scheme for injecting the metadata from the buffer into the packet processing stage.

12. The method of claim 5, wherein the method further comprises:
including in the metadata a different indication that enables statistics collection for the simulated network packet; and
determining, by a statistics collection stage implemented as part of the packet processor, that the metadata includes the different indication that enables statistics collection for the simulated network packet; and
in response to the determining, updating, by the statistics collection stage, one or more statistics based on the simulated network packet.

13. The method of claim 5, wherein providing the metadata to the controller comprises writing the metadata via a direct memory access (DMA) channel between the packet processor and a memory accessible to the controller.

14. A system, comprising:
a device configured to perform packet processing, the device comprising:
a plurality of network interfaces configured to transmit and receive packets via a physical network connection to the device; and
a packet processing pipeline that processes different network packets received from different sources via the plurality of network interfaces and forwards the different network packets according to forwarding decisions determined for the different network packets by the packet processing pipeline, wherein the packet processing pipeline is configured to:
identify metadata received for processing at the packet processing pipeline as the metadata to simulate a network packet to be processed on behalf of a controller for the device, wherein the metadata is received at the packet processing pipeline without a payload via one or more other interfaces instead of the device receiving the network packet with the metadata and the payload via the plurality of network interfaces, wherein a storage component implemented within the packet processing pipeline receives the metadata via a writing operation that bypasses a packet parser that extracts respective metadata from the different network packets to separate the respective metadata from respective payloads of the different network packets such that the metadata is written to the storage component without being extracted by the packet parser, and wherein the packet parser is upstream of the storage component;
include in the metadata an indication that the metadata is for the simulated network packet;
process the metadata through a processing stage of the packet processing pipeline to determine a forwarding decision for the simulated network packet, wherein the forwarding decision is included in processed metadata output that is a processed version of the metadata;
evaluate the processed metadata output from the processing stage to identify the processed metadata output as for the simulated network packet;
override the forwarding decision for the simulated network packet; and
provide, via the one or more other interfaces, the processed metadata output for the simulated network packet to the controller for the device.

15. The system of claim 14, wherein the metadata is written by the controller to the storage component of the packet processing pipeline for storing a metadata simulated network packet, and wherein to identify the metadata as the metadata for the simulated network packet to be processed on behalf of the controller, the packet processing pipeline reads the metadata from the storage component.

16. The system of claim 15, wherein to process the metadata through the processing stage of the packet processing pipeline, the packet processing pipeline is configured to identify an available cycle for injecting the metadata into the processing stage, wherein the metadata is injected in the available cycle.

17. The system of claim 14,
wherein the packet processing pipeline comprises a packet generator and the packet parser;
wherein the packet processing pipeline is further configured to:
receive a request to generate a dummy simulated network packet at the packet generator;
generate, by the packet generator, the simulated network packet as the dummy simulated network packet; and
parse, by the packet parser, the dummy simulated network packet to extract the metadata for the dummy simulated network packet.

18. The system of claim 17, wherein to provide the processed metadata output for the network packet to the controller for the device, the packet processing pipeline is configured to write the dummy simulated network packet including the processed metadata output via a direct memory access (DMA) channel between the device and a memory accessible to the controller.

19. The system of claim 14, wherein the packet processing pipeline further comprises a statistics collection stage that collects statistics for the packet processing pipeline and wherein the packet processing pipeline is further configured to:
include in the metadata a different indication that statistics collection is disabled for the simulated network packet;
determine, at the statistics collection stage, that the metadata includes the different indication that statistics collection is disabled for the simulated network packet; and
exclude the simulated network packet from the statistics collected at the statistics collection stage.

20. The system of claim 14, wherein the device is an application specific integrated circuit (ASIC), a system-on-chip (SoC), or a field-programmable gate array (FPGA).

* * * * *